(12) United States Patent
Zheng

(10) Patent No.: US 10,271,403 B2
(45) Date of Patent: Apr. 23, 2019

(54) OPTICAL MODULE

(71) Applicants: Hisense Broadband Multimedia Technologies, Co., Ltd., Qingdao, Shandong (CN); Hisense Broadband Multimedia Technologies, Ltd., Tortola (VG)

(72) Inventor: Long Zheng, Shandong (CN)

(73) Assignees: Hisense Broadband Multimedia Technologies Co., Ltd., Qingdao, Shandon (CN); Hisense Broadband Multimedia Technologies, Ltd., Tortola (VG)

( * ) Notice: Subject to any disclaimer, the term of this patent is extended or adjusted under 35 U.S.C. 154(b) by 0 days.

(21) Appl. No.: 15/857,884

(22) Filed: Dec. 29, 2017

(65) Prior Publication Data

US 2018/0292619 A1  Oct. 11, 2018

(30) Foreign Application Priority Data

Apr. 6, 2017 (CN) .......................... 2017 1 0220900
May 17, 2017 (CN) .......................... 2017 1 0365787
(Continued)

(51) Int. Cl.
*G02B 6/42* (2006.01)
*H05B 37/02* (2006.01)
(Continued)

(52) U.S. Cl.
CPC .......... *H05B 37/0209* (2013.01); *F21V 5/04* (2013.01); *F21V 23/005* (2013.01);
(Continued)

(58) Field of Classification Search
None
See application file for complete search history.

(56) References Cited

U.S. PATENT DOCUMENTS 7,186,150 B1 * 3/2007 Boone .................. H01R 12/727
439/680
2013/0094167 A1 * 4/2013 Chen ....................... G06F 1/185
361/791
(Continued)

*Primary Examiner* — Tina M Wong
(74) *Attorney, Agent, or Firm* — Brinks Gilson & Lione

(57) ABSTRACT

This disclosure relates to optical module. In one implementation, the optical module includes a multi-layer circuit board, a first optical chip, a second optical chip, and a processor, wherein a surface layer on a same side of the circuit board comprises a first row of edge connector pins and a second row of edge connector pins; the first row of edge connector pins comprise a first power pin; the second row of edge connector pins comprise a second power pin; the first power pin is connected to the first optical chip; the second power pin connected to the second optical chip and the processor; the first power pin and the second power pin are aligned along a same direction and are arranged at a same position among the first row of edge connector pins and the second row of edge connector pins; and the first power pin is electrically connected to the second power pin. In another implementation, the first power pin and the second power pin is not electrically connected and wherein the circuit board further comprises a power delay circuit between the second power pin and the processor.

20 Claims, 11 Drawing Sheets

(30) Foreign Application Priority Data

| | | |
|---|---|---|
| May 23, 2017 | (CN) | 2017 1 0370658 |
| Jul. 19, 2017 | (CN) | 2017 1 0592117 |
| Aug. 17, 2017 | (CN) | 2017 1 0706221 |
| Aug. 22, 2017 | (CN) | 2017 1 0725586 |
| Sep. 18, 2017 | (CN) | 2017 1 0842912 |
| Oct. 10, 2017 | (CN) | 2017 1 0934006 |

(51) Int. Cl.

| | |
|---|---|
| *F21V 29/504* | (2015.01) |
| *F21V 29/508* | (2015.01) |
| *F21V 29/83* | (2015.01) |
| *F21V 5/04* | (2006.01) |
| *F21V 23/00* | (2015.01) |
| *H05K 9/00* | (2006.01) |
| *H04B 10/40* | (2013.01) |
| *H04B 10/50* | (2013.01) |
| *H04B 10/85* | (2013.01) |
| *H04B 15/02* | (2006.01) |

(52) U.S. Cl.
CPC .......... *F21V 29/504* (2015.01); *F21V 29/508* (2015.01); *F21V 29/83* (2015.01); *G02B 6/4206* (2013.01); *G02B 6/428* (2013.01); *G02B 6/4214* (2013.01); *G02B 6/4246* (2013.01); *G02B 6/4251* (2013.01); *G02B 6/4256* (2013.01); *G02B 6/4274* (2013.01); *G02B 6/4283* (2013.01); *G02B 6/4292* (2013.01); *H04B 10/40* (2013.01); *H04B 10/503* (2013.01); *H04B 10/85* (2013.01); *H04B 15/02* (2013.01); *H05K 9/0058* (2013.01)

(56) References Cited

U.S. PATENT DOCUMENTS

2015/0062797 A1* 3/2015 Yin .................. G06F 1/185
 361/679.32
2015/0067388 A1* 3/2015 Xiao .................. G06F 11/1415
 714/6.12

\* cited by examiner

OPTICAL MODULE

CROSS REFERENCES

The present application claims priority to Chinese Patent Application No. 201710934006.X filed on Oct. 10, 2017, Chinese Patent Application No. 201710842912.7 filed on Sep. 18, 2017, Chinese Patent Application No. 201710725586.1 filed on Aug. 22, 2017, Chinese Patent Application No. 201710706221.4 filed on Aug. 17, 2017, Chinese Patent Application No. 201710592117.7 filed on Jul. 19, 2017, Chinese Patent Application No. 201710370658.5 filed on May 23, 2017, Chinese Patent Application No. 201710365787.5 filed on May 17, 2017, and Chinese Patent Application No. 201710220900.0 filed on Apr. 6, 2017, which are herein incorporated by reference in their entireties.

The present application further is relevant to the following four (4) U.S. patent applications, filed concurrently with the present application, the entireties of which are hereby incorporated by reference: U.S. patent application Ser. No. 15/857,885, entitled "Optical Module," filed Dec. 29, 2017; U.S. patent application Ser. No. 15/857,942, entitled "Optical Module," filed Dec. 29, 2017; U.S. patent application Ser. No. 15/857,987, entitled "Optical Module," filed Dec. 29, 2017; and U.S. patent application Ser. No. 15/857,958, entitled "Optical Module," filed Dec. 29, 2017.

BACKGROUND

Technical Field

The present disclosure relates generally to the field of optical communications, and particular to an optical module.

Related Art

An optical module is a core device in an optical communications system. An optical module performs mutual conversion between an optical signal and an electrical signal.

FIG. 1 is a schematic diagram of an optical module. As shown in FIG. 1, an optical module includes an upper housing C1, a lower housing C2, an optical component CH, and a circuit board 103. The optical component CH is connected to the circuit board using a flexible circuit board. The upper housing and the lower housing form a cavity that encloses the optical component and the circuit board. At one end of the optical component is an optical interface of the optical module. An input optical fiber is connected to the optical interface. At the end of the circuit board is an electrical interface of the optical module. The electrical interface is configured to be connected to an external electronic system.

A processor, an optical chip, and an edge connector are further included on the surface of the circuit board. Some pins of the processor and the optical chip may be separately connected to pins of the edge connector. The edge connector includes multiple pins such as a ground pin, a power pin, and a data pin.

The edge connector of the optical module may be configured to be inserted into an edge connector socket of an external system or system cage. The edge connector socket may include contact spring plates having a one-to-one correspondence to the pins of the edge connector. To integrate the optical module with the external electronic system, the circuit board is inserted into the edge connector socket. When the circuit board is inserted, the contact spring plates nip the edge connector of the circuit board, forming electrical contact with the pins of the edge connector. A power spring plate may become correspondingly in contact with a power pin. Likewise, a data spring plate may become in contact with a data pin, and a ground spring plate may become in contact with a ground pin. The external electronic system supplies power to the processor and the optical chip using the power pin of the edge connector, exchanges data with the processor and the optical chip using the data pin, and provides a ground connection with the processor and the optical chip using the ground pin.

The edge connector of the circuit board may include a row of connector pins. Functions of edge connector pins may be specified in detail according to industry standards governing optical communications and optical modules such that the edge connector pins can meet power requirement and data communication requirement of the processor and the optical chip of the optical module. The industry standards specify correspondence relationship between edge connector pins, the processor, and the optical chip.

The number of pins in a row of an edge connector may be limited by the space available for the edge connector on the circuit board. As numbers of optical chips and processors of the optical module increase, more pins may need to be provided in the edge connector.

FIG. 2 is a schematic diagram of an edge connector. Because of the correspondence relationship between the edge connector pins, the processor, and the optical chip, when an extra optical chip is added to the optical module, an additional row of edge connector pins may be added to the edge connector. Specifically, a first row of edge connector pins may correspond to a first set of optical chips, and a second row of edge connector pins may correspond to another set of optical chips.

Correspondingly, the external electronic system may provide a first row of contact spring plates and a second row of contact spring plates, to provide connection to the double-row edge connector pins.

In a power-on process for the optical module, power is first supplied to the optical module, and then data communication is activated. The first row of contact spring plates and the second row of contact spring plates separately include power spring plates and ground spring plates. The positions of power pins and power spring plates may be configured to be the same for each row of edge connector pins and the socket, in order to avoid electric damage caused by contacting a power spring plate in one row with data pin of another row when the edge connector pins are inserted into a corresponding socket of contact spring plates.

In a double-row configuration and even when power pins are aligned between the first and second rows, when the edge connector pins are inserted into a corresponding socket of contact spring plates, the power pin of the second row of the edge connector pins is first in contact with the power spring plate of the first row spring plates of the socket. Such contact is subsequently lost as the edge connector pins is continually inserted into the socket such that the power pin of the second row is inserted between the power spring plate of the first row and the power spring plate of the second row in the socket. As the edge connector pins is inserted even further, the power pin of the second row is again in contact with external power source when it becomes in contact with the power spring plate of the second row in the socket. This insertion process causes power cycles in the processor and the optical chip whose power is supplied through the power pin on the second row of the edge connector. As a result, the processor and the optical chip may be intermittently powered and may not start normally, and may be susceptible to damage.

SUMMARY

Various implementation of an optical module is disclosed for ensuring stable power supply to a processor or microcontroller unit (MCU) when the optical module is inserted into an external system.

In one implementation, an optical module is disclosed. The optical module comprises a multi-layer circuit board, a first optical chip, a second optical chip, and a processor, wherein a surface layer on a same side of the circuit board comprises a first row of edge connector pins and a second row of edge connector pins; the first row of edge connector pins comprise a first power pin; the second row of edge connector pins comprise a second power pin; the first power pin is connected to the first optical chip; the second power pin connected to the second optical chip and the processor; the first power pin and the second power pin are aligned along a same direction and are arranged at a same position among the first row of edge connector pins and the second row of edge connector pins; and the first power pin is electrically connected to the second power pin.

In another implementation, in the optical module above, the first row of edge connector pins are connected to wire traces on the surface layer of the circuit board, and the second row of edge connector pins are connected to wire traces of an inner layer of the circuit board using connection holes on the circuit board.

In another implementation, an optical module is disclosed. The optical module comprise a multi-layer circuit board comprising a first circuit and a second circuit disposed on separate layers of the circuit board; and an edge connector; a first optical chip; a second optical chip; and a processor, wherein the edge connector comprises a first row of edge connector pins and a second row of edge connector pins arranged respectively into a first array and a second array; the first row of edge connector pins comprise a first power pin connected to the first optical chip using the first circuit; the second row of edge connector pins comprise a second power pin connected to the second optical chip and the processor using the second circuit; the second circuit comprises a power delay circuit; and the first power pin and the second power pin are aligned along a same direction.

In yet another implementation and in the optical module above, the power supply delay circuit includes a resistor, a capacitor, and a field-effect transistor, wherein a source electrode of the field-effect transistor is connected to the second power pin and one end of the capacitor; a drain electrode of the field-effect transistor is connected to the processor; a gate electrode of the field-effect transistor is connected to another end of the capacitor and one end of the resistor; and another end of the resistor is connected to ground.

BRIEF DESCRIPTION OF THE DRAWINGS

To describe more effectively the technical solutions in the embodiments of the present disclosure, the following briefly describes the accompanying drawings. These drawings are only examples of the present disclosure. Persons of ordinary skill in the art can further obtain other exemplary drawings according to the accompanying drawings without creative efforts.

FIG. 8 is a time-sequence diagram showing a power-on process of an optical module and an MCU using the double-row edge connector of FIG. 6a;

DETAILED DESCRIPTION

The following describes the technical solutions of the present disclosure with reference to the accompanying drawings. The described embodiments are merely examples. All other embodiments obtained by persons of ordinary skill in the art based on the examples without any creative work fall within the protection scope of the present disclosure.

Figure 1:
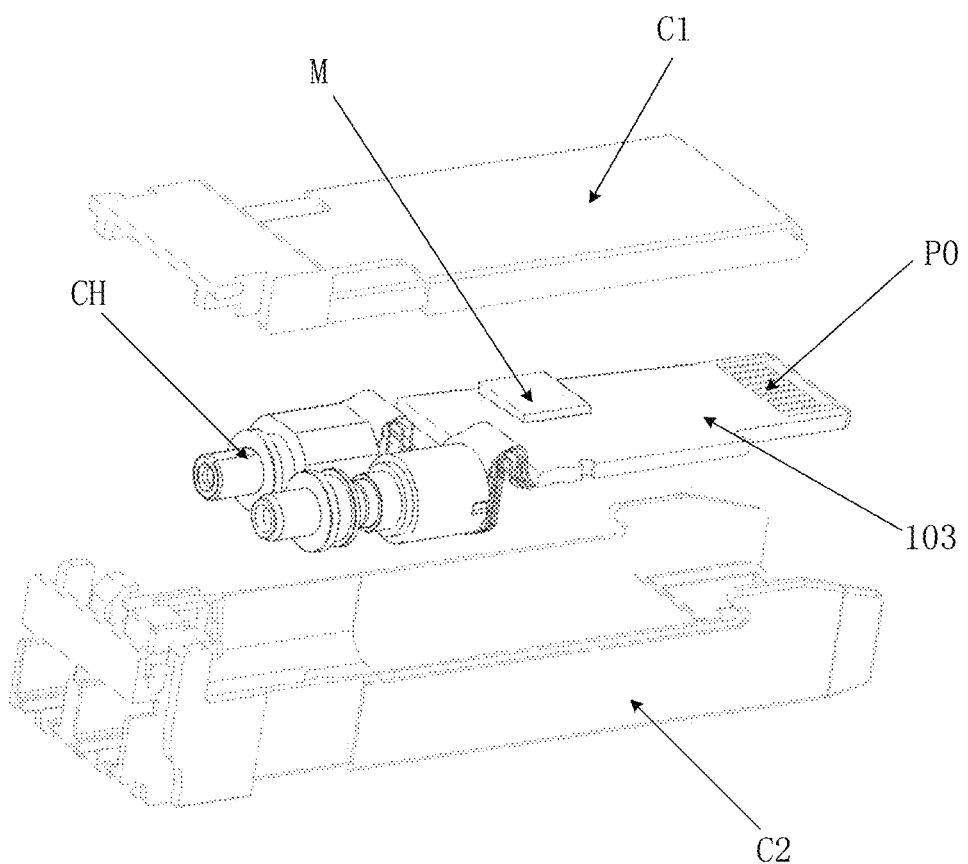
FIG. 1 is a schematic diagram of an optical module.

FIG. 1 is a schematic diagram of an optical module. As shown in FIG. 1, the optical module includes an upper housing C1, a lower housing C2, an optical component CH, and a circuit board 103. The optical component includes an optical chip (a laser driver chip or a light detection chip), and the circuit board includes an electrical device such as a microprocessor or microcontroller unit (MCU), alternatively referred to as a processor.

The optical chip may be of different types and thus may be connected to the circuit board in different manners. The optical chip may be placed on the circuit board, or may be placed in the optical component. The MCU may be placed on the circuit board, or may be placed in the optical component. The optical chip and the MCU are both electrically connected to the circuit board.

The optical module needs to be inserted into a system cage during operation. Specifically, an edge connector PO of the circuit board is inserted into an edge connector socket in the system cage. Power is then supplied via the edge connector to the circuit board, including electrical devices such as the optical chip, the laser driver chip, and the MCU.

The edge connector and the edge connector socket provided in the implementations of the present disclosure are hot-swappable. Specifically, the edge connector socket is hot in that it is powered during insertion of the edge connector. When the edge connector is inserted and becomes in contact with contact spring plates in the edge connector socket, an electrical device (such as the microprocessor, the optical chip, or the laser driver chip) connected to the edge connector would be powered.

The edge connector on the insertion end of the circuit board may be directly formed on the surface of the circuit board, or may be an independent component installed on the edge of the circuit board. The circuit board includes two opposite surfaces on which pins of an edge connector may be formed. In one implementation, a first row of edge connector pins and a second row of edge connector pins may be formed on one surface and on a same side of the circuit board. Other edge connector pins may be formed or may not be formed on the other surface of the circuit board. The circuit board includes conducting traces. The conducting traces connect electrical devices such as the laser driver chip and the MCU to the pins of the edge connector.

The pins of the edge connector may be divided into different types including but not limited to power pins, data pins, and ground pins. Existing industry standards may further dictate functions and electric characteristics of various pins in a row of pins of the edge connector. Optical module product may evolve over time and rows of pins may be added during the evolution. For example, a circuit board of an optical module in its initial version may include an edge connector having a single row of pins on a single surface of the circuit board, or having a single row of pins on each of the two surfaces of the circuit board. The single row of pins may be arranged into an array of the edge connector pins along a direction perpendicular to a length direction of the circuit board. The pins may extends along an insertion direction parallel to the length direction of the circuit board. The geometrical characteristics, functions, and electric characteristics of this single row of pins may be defined according to industry standards such that the edge connector, the optical chip, the MCU function as a coordinated system.

When an additional optical chip is added during the evolution of the optical module, new pins may need to be correspondingly added. Because the area and dimension of the circuit board is limited, it may be difficult to add the new pins to the existing row of pins of the edge connector.

In one implementation, the new pins may be added as a second row of pins in the edge connector. The newly added pins may be independently arranged to function with the newly added optical chip and form another coordinated system according to industrial standards.

Figure 2:
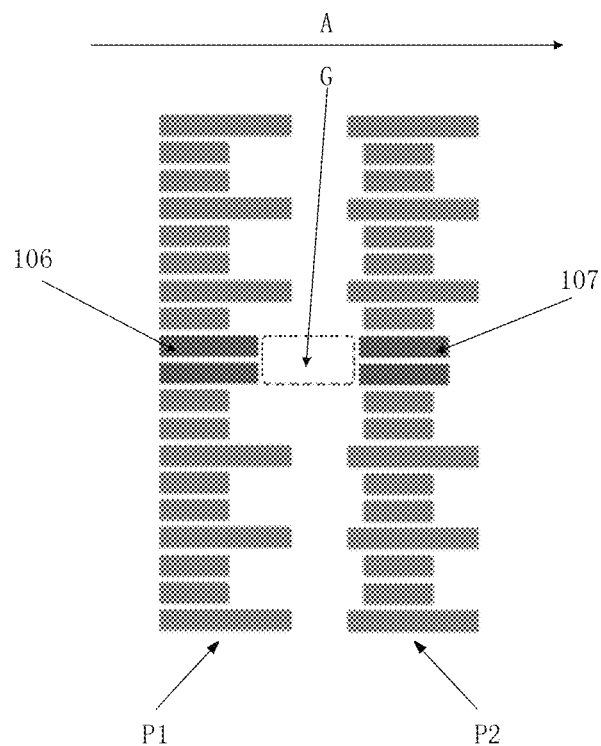
FIG. 2 is a schematic diagram of an edge connector of a circuit board with double rows of pins.

FIG. 2 is a schematic diagram of an edge connector having double rows of pins. As shown in FIG. 2, there is an insulation gap G between a newly added row of edge connector pins P1 (the first row) and the original row of edge connector pins P2 (the second row). When the edge connector of the optical module is inserted into a system cage along a direction indicated by arrow A, spring plates of a first row of contact spring plates of the system cage are first in contact with the second row of pins P2 of the edge connector. Because the spring plates of the first row of contact spring plates of the system cage are designed to function with the first row of pins P1 of the edge connector, the optical chips or MSU associated with the second row of pins P2 of the edge connector may be erroneously powered. Likewise, data lines in the optical module associated with the second row of pins P2 of the edge connector may be erroneously electrically charged.

In one implementation, the erroneous charged signal lines may be self discharged. For adequate self-discharging, a sufficient time interval needs to be reserved between a time at which the first row of contact spring plates loses contact with the second row of pins of the edge connector and a time at which the second row of contact spring plates become in contact with the second row of pins of the edge connector during the insertion of the edge connector into the system cage.

Self-discharging of the pins thus requires a sufficient insulation gap between pins of the first row of the edge connector pins and pins of the second row of the edge connector pins. The insulation gap may be made as large as possible if the circuit board has sufficient space for the edge connector.

The newly added row of edge connector pins P1 may be configured identically to the original row of edge connector pins P2. In some implementation, functions of some pins may be slightly adjusted. The newly added row of edge connector pins P1 are mainly configured to connect to the newly added optical chip, and therefore include power pins and signal pins. Specifically, the first row of edge connector pins P1 may include a first power pin 106. The second row of edge connector pins P2 may include a second power pin 107. The first power pin 106 and the second power pin 107 may be aligned along a same extension direction.

In the implementation above, the edge connector of the optical module includes two rows of pins. The second power pin 107 of the second row is closer to the edge of the circuit board compared with the first power pin 106 of the first row. The first row of edge connector pins are configured to provide electrical signals for the first optical chip, and the second row of edge connector pins are configured to provide electrical signals for the second optical chip. Specifically, the first power pin 106 is connected to the first optical chip, and the second power pin 107 is connected to the second optical chip.

An MCU may be connected to an external system by using the first row of edge connector pins, or may be connected to an external system by using the second row of edge connector pins. There may be one or more MCUs. When there is one MCU, the MCU can support and provision both the first optical chip and the second optical chip. When there are two or more MCUs, a first MCU may support and provision the first optical chip, and a second MCU may support and provision the second optical chip.

Figure 3:
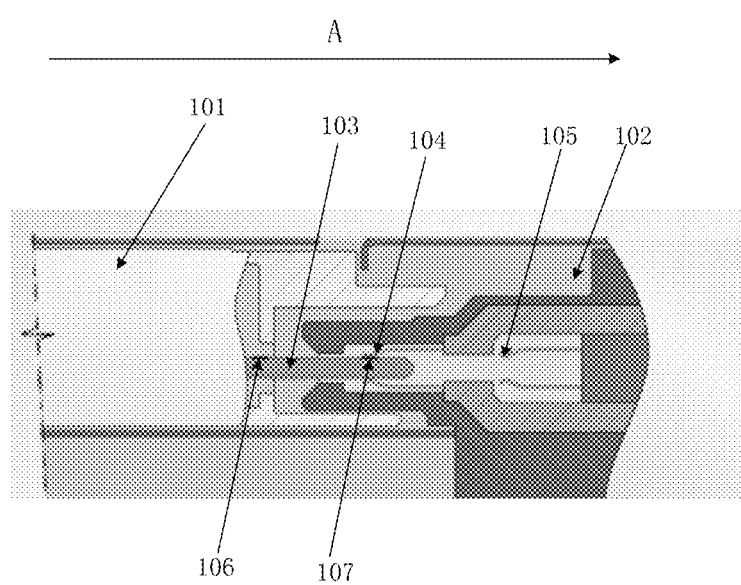
FIG. 3 is a schematic diagram showing insertion of a double-row edge connector into an edge connector socket.

The double-row edge connector of the optical module above functions in coordination with a corresponding double-row edge connector socket of the external system cage. The edge connector socket is a component in the external system cage that receives the edge connector of the optical module. FIG. 3 is a schematic diagram showing insertion of the double-row edge connector into the double-row socket. As shown in FIG. 3, an optical module 101 is inserted into an external system 102. The surface of the circuit board 103 of the optical module includes the first power pin 106 and the second power pin 107, and the edge connector socket includes a first row of contact spring plates 104 and a second row of contact spring plates 105. When the edge connector of the optical module is inserted, pins of the edge connector slide towards a direction of a contact spring plate along a direction indicated by arrow A. As the pins slide to make contact with the spring plates, electrical connection is established.

The contact spring plates of the socket are divided into power spring plate, signal spring plates, and ground spring plates respectively corresponding to power pins, signal pins, and ground pins in the edge connector. Electric voltages carried by the power pins may be relatively high, and electric voltages carried by a signal pins may be relatively low.

There are two rows of edge connector pins in the optical module. Correspondingly, there are two rows of contact spring plates in the edge connector socket. In a fully inserted state, the power spring plate of the first row of contact spring plates 104 is in contact with the first power pin 106 in the first row of pins, and the power spring plate of the second row of contact spring plates 105 is in contact with the second power pin 107 of the second row of pins. In an insertion process, the pins of the edge connector slides towards the contact spring plates along the direction indicated by arrow A. Therefore, the power spring plate of the first row of contact spring plates 104 is sequentially in contact with the second power pin 107 and the first power pin 106 of the edge connector. If a pin in the first row of pins aligned with the second power pin 107 is a non-power pin and when the second power pin 107 is in contact with the first row of contact spring plates 104, a high voltage may be applied to a low voltage device corresponding to the non-power pin in the first row of pins. The low-voltage device may be damaged. Therefore, it is preferable that the power pin of the first row of pins of the edge connector pins and the power pin of the second row of pins of the edge connector are aligned along the insertion direction and located at a same position along a direction perpendicular to the insertion direction. As such, the first power pin 106 of the first row of pins of the edge connector and the second power pin 107 of the second power source pins sequentially pass through a same contact spring plate in the socket during insertion.

When the edge connector is inserted into the external system cage, the second power pin 107 is first in contact with the power spring plate of the first row of contact spring plates. As the edge connector slides further, the second power pin disconnects from the power spring plate of the first row of contact spring plates, and then the second power pin 107 is in contact with the power spring plate of the second row of contact spring plates.

Figure 4:
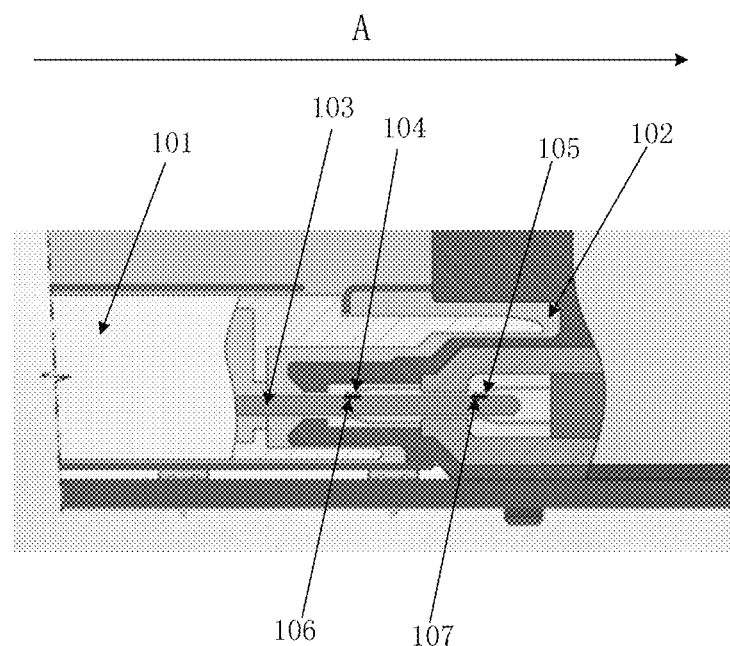
FIG. 4 is another schematic diagram showing insertion of a double-row edge connector into an edge connector socket.

FIG. 4 is a schematic diagram in which the double-row edge connector is fully inserted into the edge connector socket. As shown in FIG. 4, in a fully asserted state, the first power pin 106 is in contact with the power spring plate of the first row of contact spring plates 104, and the second power pin 107 is in contact with the power spring plate of the second row of contact spring plates 105.

The sliding relationship during an insertion is relative. In particular, the descriptions above refers to sliding the edge connector pins towards the socket. It may be alternatively understood as sliding the socket towards the edge connector pins, e.g., that the power spring plate of the first row of contact spring plates slides towards a direction of the second power pin of the edge connector, and then continues to slide towards the first power pin of the edge connector.

During a power-on process, power is first supplied to the optical module, and then data communication is activated. The first row of contact spring plates and the second row of contact spring plates both include a power spring plate and a ground spring plate. The power pins in each row of the edge connector are aligned along the insertion direction. Likewise, the power spring plates in each row of the socket are aligned along the insertion direction. Such arrangement helps avoid powering of non-power pins and damage to the optical module when the edge connector is inserted into the socket. During the insertion process, the power spring plate of the first row of contact spring plates sequentially slides through the second power pin in the second row of pins of the edge connector and the first power pin in the first row of pins of the edge connector.

Figure 5:
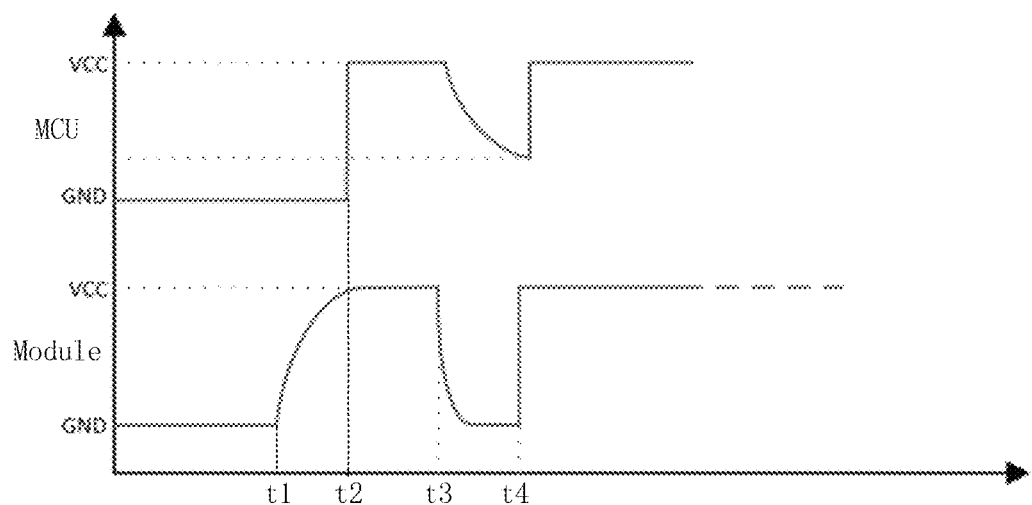
FIG. 5 is a time-sequence diagram showing a power-on process of an optical module and an MCU.

The second power pin 107 thus goes through three states of power cycles: power on, power off, and power on again. FIG. 5 is a time-sequence diagram showing the power-on of the optical chip and the MCU. At time t1, the second power pin 107 is powered by the power spring plate in the first row of contact spring plates in the socket. As a result, the optical module connected to the second power pin 107 starts its power-on process. A soft power-on process may be used, as shown by the gradual rise of voltage seen by the optical module between time t1 and time t2. At time t2, the voltage at the optical module reaches a standard voltage vcc. After the voltage at the optical module is stabilized, the MCU starts its powered-on procedure. As the edge connector continues to slide and at time t3, the second power pin 107 in the second row of pins of the edge connector pins loses its contact with the power spring pate in the first row of contact spring plates of the socket. The optical module and the MCU start their power-off processes. At time t4, the second power pin in the second row of edge connector pins make contact with the power spring plate in the second row of contact spring plates of the socket. The optical module and the MCU begin their power-on processes again. As can be seen from the time sequence of the power voltage at the MCU in FIG. 5, when the edge connector is inserted into the edge connector socket, the MCU goes through a process of power on, power off, and power on again. Although the soft power-on technology may be used, a soft-start time from t1 to t2 may be far less than a time it takes to slide the second row of edge connector pins to the second row of contact spring plates.

When the edge connector is inserted into the socket of the external system cage, the first power pin of first row of pins in the edge connector slides towards the first row of contact spring plates of the socket. In the insertion process, the first power pin is in a power-off state prior to making contact with the power spring plates in the first row of contact spring plates of the socket. The first power pin switches to a power-on state only when the first power pin makes contact with the power spring plate of the first row of contact spring plates of the socket.

In the implementations above, the size of each pin of the first row of the edge connector pins complies with the industry standards. Further, the size of each pin of the second row of edge connector pins complies with the industry standards.

When the second power pin is in contact with the power spring plate of the first row of contact spring plates, the power spring plate supplies power to the second power pin. In this case, the optical chip, the laser driver chip, and the MCU connected to the second power pin perform power on initialization upon being powered, and the MCU starts to run an initialization program and generates initialization data.

As the edge connector continues to slides, the second power pin loses contact with the power spring plate of the first row of contact spring plates, and the foregoing power on initialization is suddenly interrupted.

As the edge connector continues to slide, the second power pin becomes in contact with the power spring plate of the second row of contact spring plates. The optical chip, the laser driver chip, and the MCU connected to the second power pin are powered on again.

In a process of power on, power off, and power on again in a short period of time, the MCU chip is reset at powered on. In particular, all settings and registers of the MCU are reset to a default state or values. A reset state may be unstable because the voltage seen within the MCU is not at a normal working voltage. A program to be run by the MCU may be lost or becomes corrupted. This process causes running error in the MCU or another chip used in the optical module. The MCU may not start and initiate properly. Programs may be lost, affecting the normal operation of the optical module.

Figure 6A:
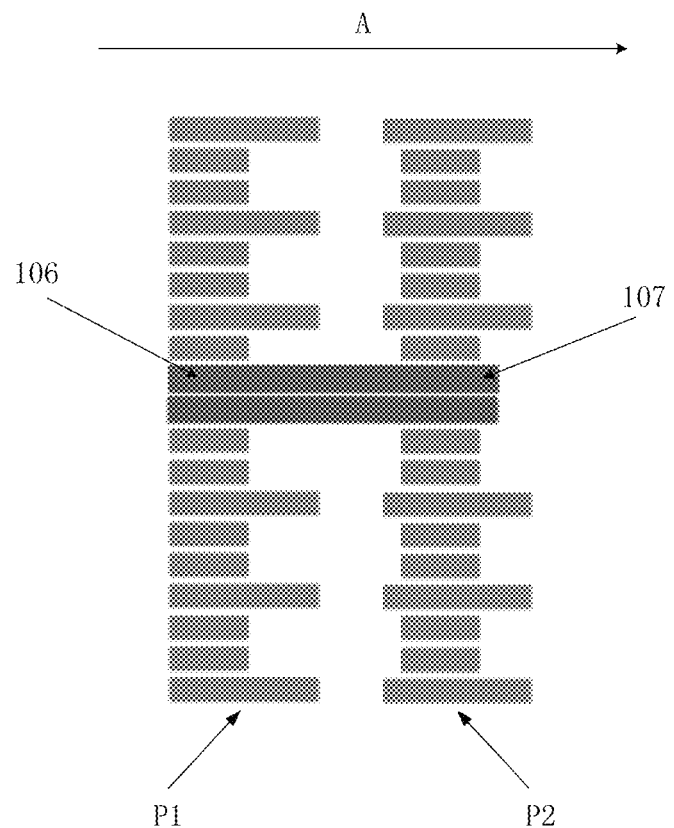
FIG. 6a is a schematic diagram of a double-row edge connector pin arrangement of an optical module.

FIG. 6a is a schematic diagram of a double-row edge connector of an optical module according to another implementation of the present disclosure. As shown in FIG. 6a, in the optical module provided in this implementation, the first power pin 106 is connected to the second power pin 107. The first row of edge connector pins are connected to a wire traces on the surface layers of a multi-layer circuit board, and the second row of edge connector pins are connected to wire traces in an inner layer of the circuit board using via connection holes.

Figure 7:
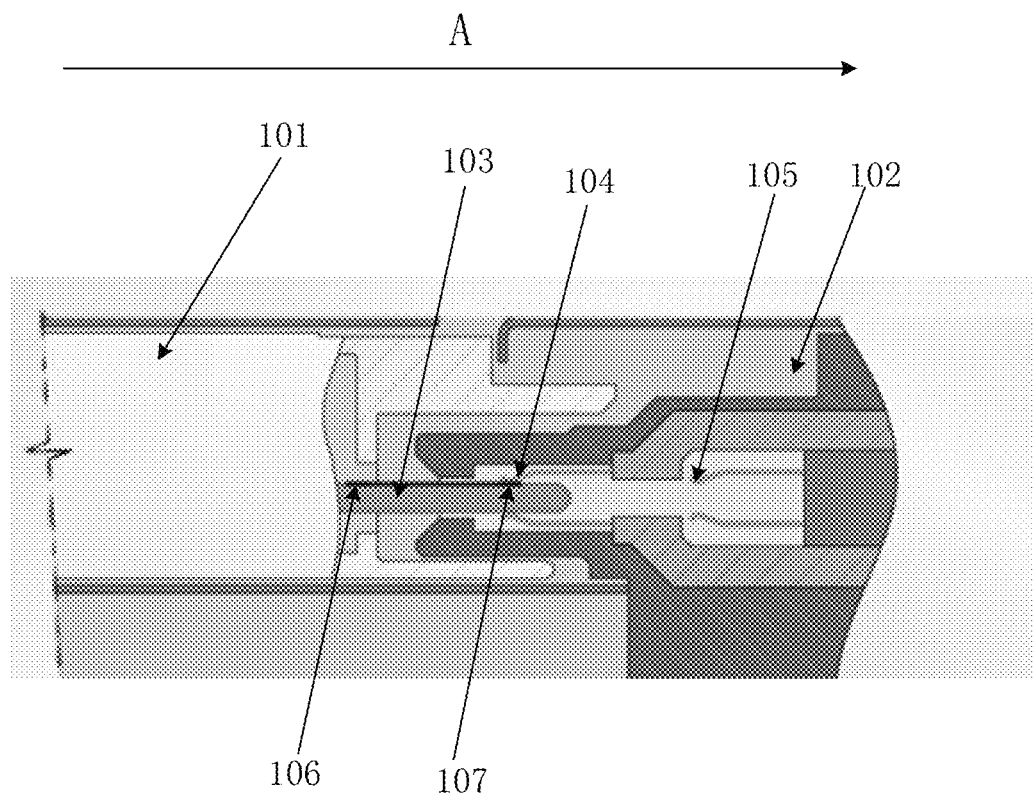
FIG. 7 is a schematic diagram showing insertion of a double-row edge connector into an edge connector socket.

FIG. 7 is a schematic diagram showing insertion of the double-row edge connector of FIG. 6a into a corresponding double-row socket. As shown in FIG. 7, when the edge connector of the optical module is inserted, the power spring plate of the first row of contact spring plates 104 in the edge connector socket makes contact with the second power pin 107 of the second row of edge connector pins. As the optical module is continually inserted, the power spring plate of the first row of contact spring plates slides from the second power pin 107 to the first power pin 106. Because the first power pin 106 is aligned with and electrically connected to the second power pin 107, the second power pin 107 is always electrically connected to the power spring plate of the contact spring plates in the socket. As such, the second power pin continues supplying power to the optical module. In this implementation, a current surge and power cycles may be avoided. Damages to the optical module (e.g., the MCU) may thus be avoided.

Figure 8:
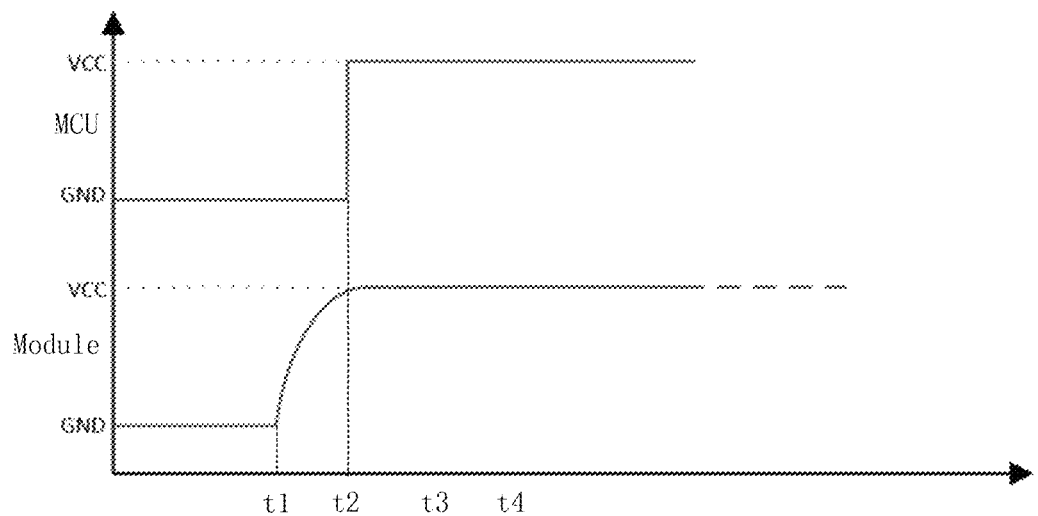

FIG. 8 is a time-sequence diagram showing a power-on process for an optical module and an MCU associated with the edge connector of FIG. 6a during insertion process. As shown in FIG. 8, after the optical module and the MCU are powered on at time t2 by making contact between the second power pin and the power spring plate in the socket, the optical module and the MCU maintain its power-on state at times t3 and t4.

Figure 6B:
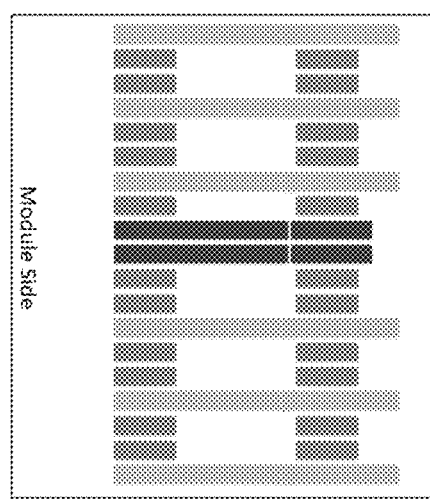
FIG. 6b shows another implementation of a double-rows edge connector.
Figure 6C:
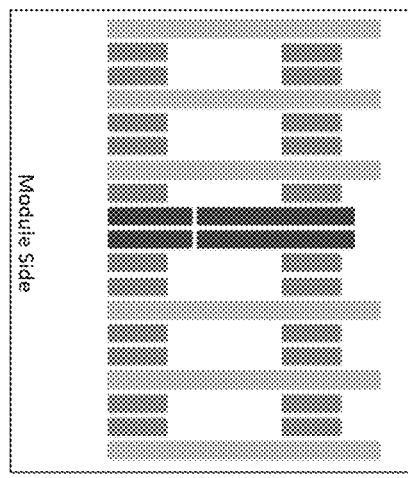
FIG. 6c shows yet another implementation of a double-row edge connector.

In another implementation of the double-row edge connector, shown in FIG. 6b and FIG. 6c, the distance or gap between the first power pin 106 and second power pin 107 of FIG. 2 along the direction indicated by arrow A may be adjusted to a small non-zero value. For example, such distance may be adjusted by extending the first row of power pins (FIG. 6b) or extending the second row of power pins (FIG. 6c) to be smaller than the length of corresponding contact spring plates in the socket 102 of FIG. 3. As such, the corresponding contact spring plates in the socket would be in contact with the first power pin 106 while leaving the second power pin 107 during the insertion process, avoiding power surges. Even if the distance between the first power pins 106 and second power pins 107 is larger than the length of the corresponding contact spring plates in the socket 102, it may still be adjusted to be sufficiently small, such that the time it takes for the pins to traverse the socket during insertion is small and insufficient to cause a power on-off surge.

Figure 6D:
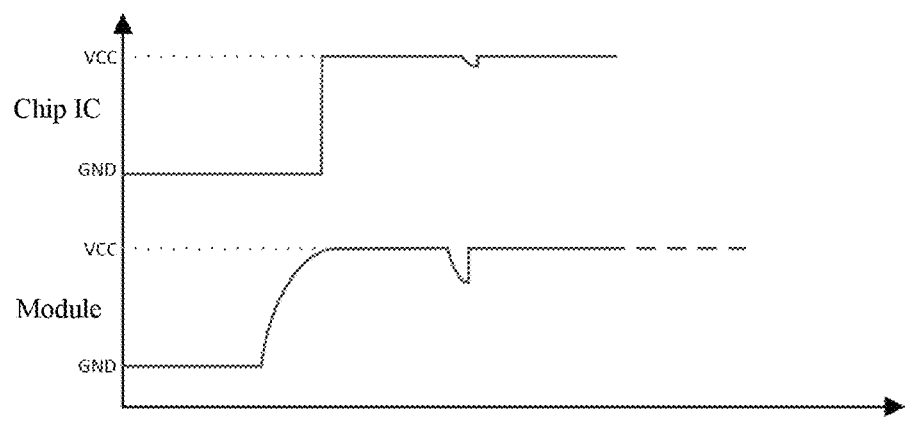
FIG. 6d shows a power-on process for the optical module and MCU using the double-row edge connector of FIG. 6b.

For the implementation of FIG. 6b, the power on process is shown in FIG. 6d for the optical module. The optical chip is powered on when the second power pin 107 in the second row of pins of the edge connector is inserted into the socket and in contact with the power contact spring plate in the first row of contact spring plates in the socket. A short period after the second row of pins leaves their corresponding contact spring plates in the socket, the optical module is powered via the power contact spring plate of the second row of contact spring plates. Because the first row and the second row of pins of the edge connector are sufficiently adjacent, the insertion only causes a small kink in the power supply to the optical chip and the MCU, as shown in FIG. 6d.

In another implementation, an optical module may include a multi-layer circuit board, a first optical chip, a second optical chip, and a processor (or MCU). The circuit board includes a first circuit and a second circuit disposed on different layers of the multi-layer circuit board. On an edge of one side of the circuit board, a double-row edge connector is formed. The edge connector includes two rows of pins. Each row of pins are arranged as discussed above. A first power pin of the first row of edge connector pins is connected to the first optical chip using the first circuit. A second power pin of the second row of edge connector pins is separately connected to the second optical chip and the processor or MCU using the second circuit. The second circuit further includes a power supply delay circuit. A first power pin is aligned with the second power pin.

Figure 9:
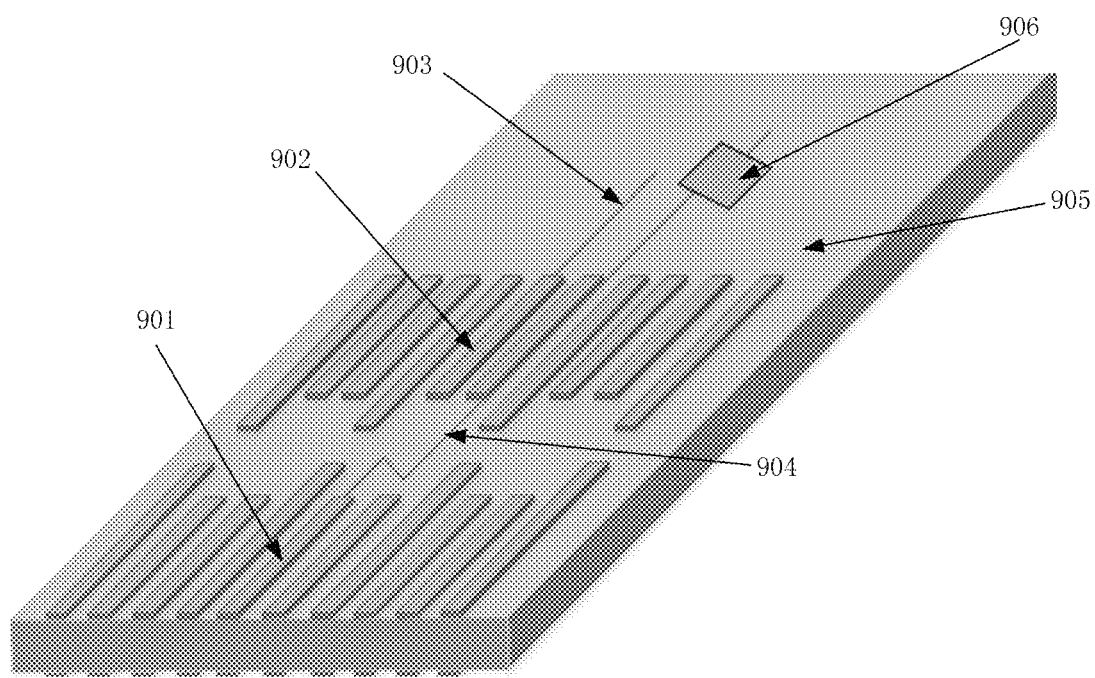
FIG. 9 is a schematic diagram of circuit board and double-row edge connector of an optical module.

FIG. 9 shows such an implementation. As shown in FIG. 9, the optical module includes a circuit board 905. Two rows of edge connector pins (a first row of edge connector pins and a second row of edge connector pins) are arranged on an edge on a side of the circuit board 905. The second row of edge connector pins is arranged to be closer to the edge of the circuit board compared with the first row of edge connector pins. The second row of edge connector pins and the first row of edge connector pins are arranged in a direction that extends from the edge on one side of the circuit board to an edge of another side. The first power pin 902 of the first row of edge connector pins is connected to the first optical chip using the first circuit 903 on a surface layer of the circuit board, and the second power pin 901 of the second row of edge connector pins is connected to the second optical chip using the second circuit 904 disposed in an inner layer of the circuit board. The second circuit 904 includes a power supply delay circuit 906. One end of the power supply delay circuit 906 is connected to the second power pin 901. The other end of the power supply delay circuit 906 is connected to the MCU and the second optical chip.

The circuit board includes multiple layers. Electric circuits may be arranged on each layer. In one implementation, the first circuit and the second circuit are disposed on different layers of the circuit board.

The first row of edge connector pins and the second row of edge connector pins may be disposed on a surface layer of the circuit board. The first and second rows of edge connector pins are sequentially arranged on an edge of a first side of the circuit board, in a direction extending from the edge of the first side to an edge of a second side of the circuit board. With this arrangement, when the circuit board of the optical module is inserted into a system cage, the second row of edge connector pins is first in contact with the edge connector socket in the cage. The first row of edge connector pins become in contact with the edge connector socket in the system cage later than the second row of edge connector pins during the insertion.

The second circuit includes the power supply delay circuit. When the second power pin of the second row of edge connector pins is in contact with the edge connector socket, the edge connector socket supplies power to the second power pin, so that power to the optical module is supplied via the second circuit. The second circuit includes the power supply delay circuit. As such, power supply to the MCU encounters a delay when passing through the power supply delay circuit. That is, although the second row of edge connector pins are in contact with the edge connector socket, power is not immediately supplied to the MCU, and is delayed by the power supply delay circuit for a predetermined time.

Figure 10:
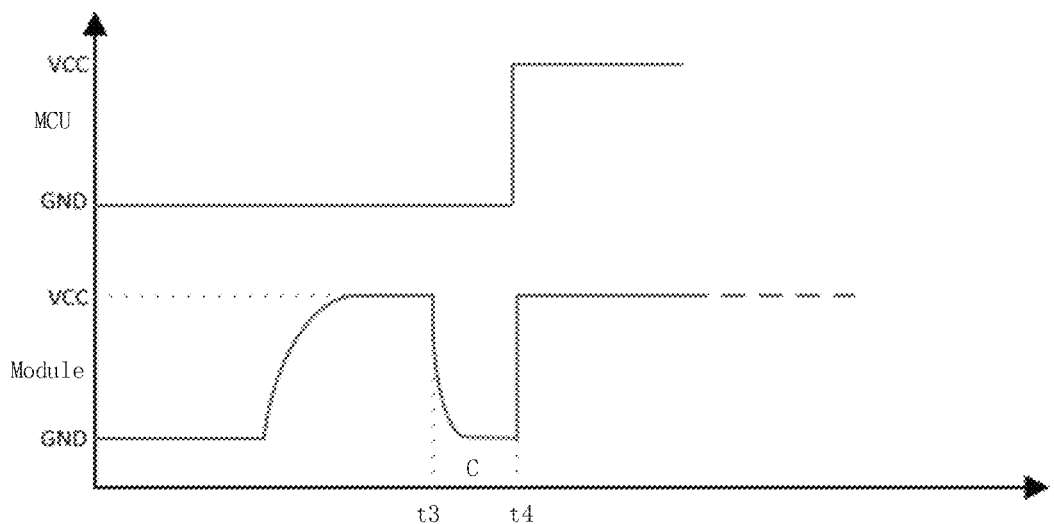
FIG. 10 is time-sequence diagram showing a power-on process of the optical module of FIG. 9.

FIG. 10 is a time-sequence diagram showing power-on process of an optical module having a double-row edge connector and power supply delay circuit of FIG. 9. As shown in FIG. 10, power to the optical module switches off within a time duration of C from t3 to t4 because the second row of edge connector pins become disconnected from the socket. The optical module is powered again at time t4 after the second row of edge connector pins become in contact again with the socket. For the MCU, however, because of the presence of the power supply delay circuit, power is supplied to the MCU only beginning at time t4. Power is not supplied to the MCU before time t4, avoiding power cycles and power surges in the MCU.

When the optical module is inserted into the system cage, the second row of edge connector pins are first supplied with power, are then powered off, and are then supplied with power again. The time duration between the power-off and the second power-on is C (FIG. 10). Without the delay circuit, the MCU would go through these power cycles. In one implementation, the time delay generated by the power supply delay circuit of the second circuit may be greater than or equal to C. Such an amount of delay can help avoid power cycles and running errors of the MCU.

Figure 11:
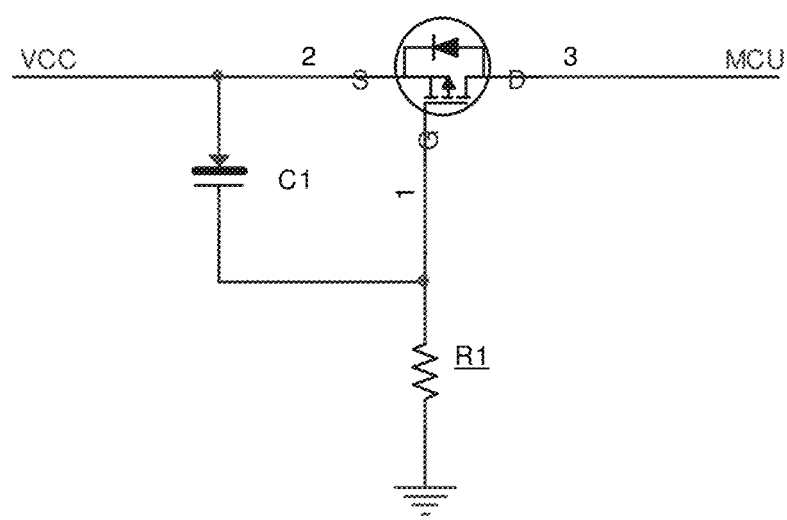
FIG. 11 shows a schematic diagram of a power supply delay circuit.

Specifically, FIG. 11 shows a power supply delay circuit according to an embodiment of the present disclosure. The power supply delay circuit includes a resistor R1, a capacitor C1, and a field-effect transistor. A source electrode of the field-effect transistor is separately connected to one end of a second power pin and one end of the capacitor. A drain electrode of the field-effect transistor is connected to the MCU. A gate electrode of the field-effect transistor is connected to the other end of the capacitor and one end of the resistor. The other end of the resistor is connected with the ground.

As shown in FIG. 11, the gate electrode of a MOS transistor is connected to a capacitor C1 and a resistor R1. The source electrode of the MOS transistor is connected to the second power pin 107 and the capacitor C1. The drain electrode of the MOS transistor is connected to an MCU. A time constant of R1C1 may be adjusted to obtain a charging time of the capacitor and to adjust a turn-on time of the MOS transistor. A delay time C=R1*C1. The unit of the resistor R1 may be MSΩ (mega-ohm), and the unit of the capacitor C1 may be µF (microfarad). FIG. 11 may be implemented using discrete components or implemented by an integrated circuit.

A delay time of a delay circuit is denoted by C. The distance between two rows of edge connector power pins is denoted by D1. The length of the first power pin of the first row of pins of the edge connector is denoted by D2. A module insertion speed is denoted by V. A specific value of C may be determined using D1+D2=V*C, that is, C=(D1+D2)/V. As such, combination or R1 and C1 can be determined using C=R1*C.

Figure 12:
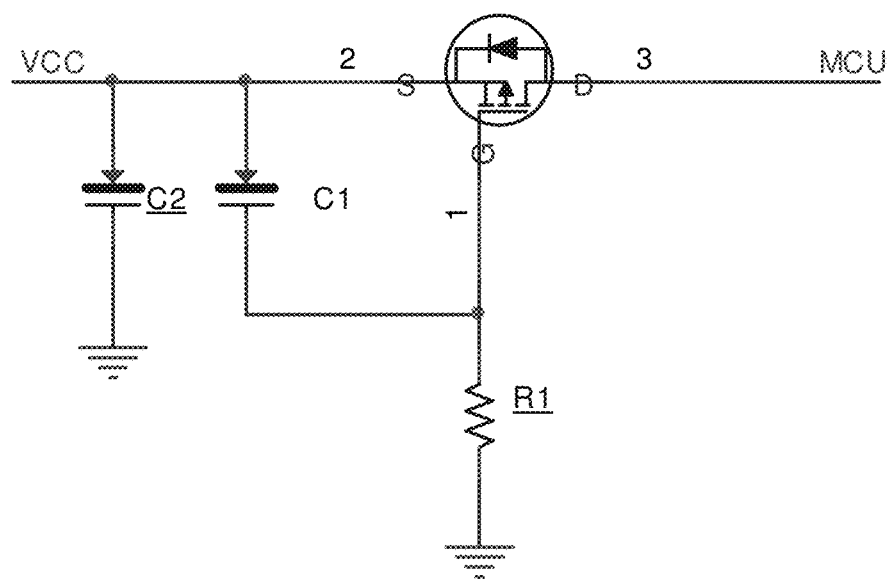
FIG. 12 shows a schematic diagram of another power supply delay circuit.
Figure 13:
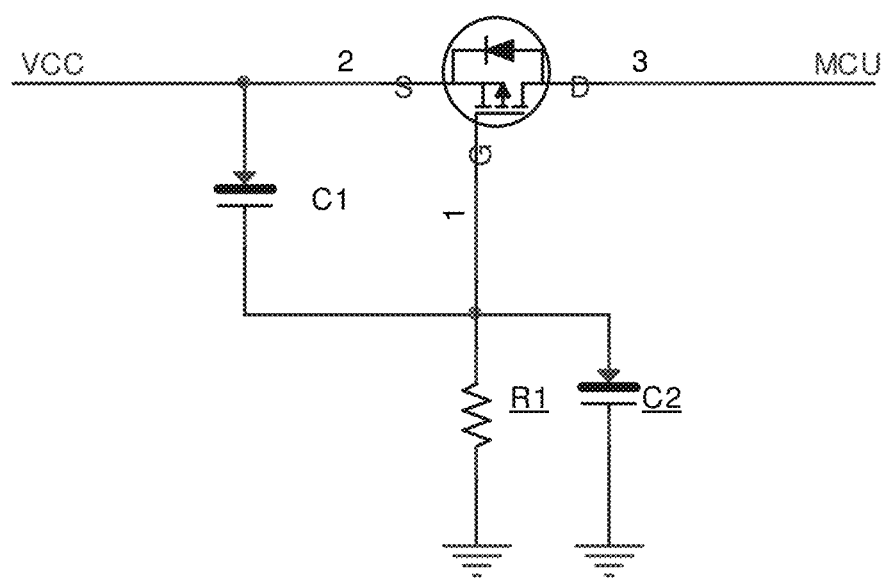
FIG. 13 shows a schematic diagram of another power supply delay circuit.
Figure 14:
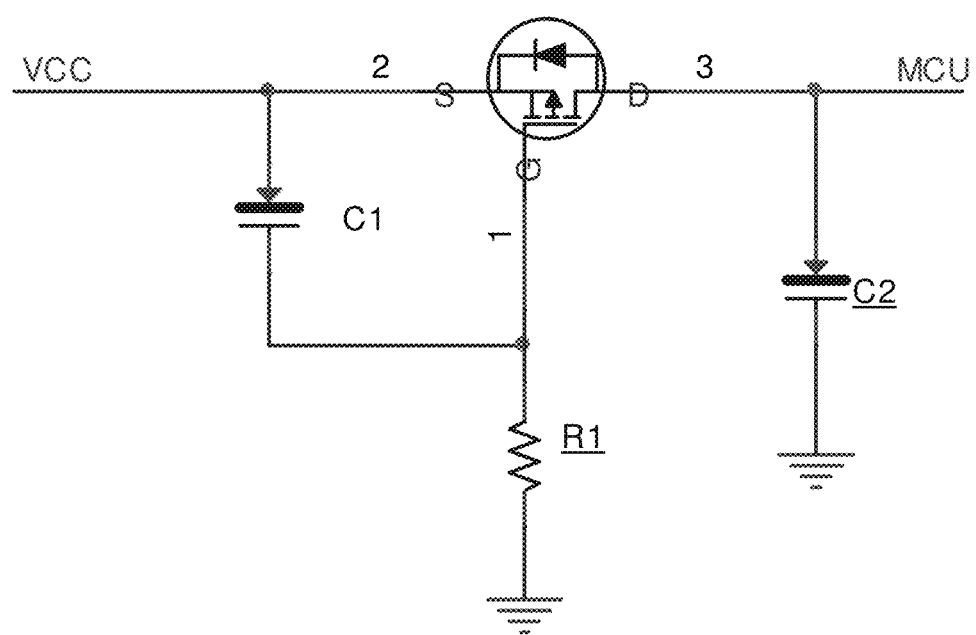
FIG. 14 shows a schematic diagram of another power supply delay circuit.

Other exemplary implementation of the power delay circuit are shown in FIG. 12, FIG. 13, and FIG. 14. In the implementation of FIG. 12, a capacitor C2 disposed between the second power pin 107 and ground is included in addition to the implementation of FIG. 11. In the implementation of FIG. 13, a capacitor C2 is disposed in parallel to the resistor R1 in addition to the implementation of FIG. 11. In implementation of FIG. 14, a capacitor C2 is disposed between the drain electrode of the field effect transistor and the ground in addition to the implementation of FIG. 11. Those of ordinary skill in the art understand how to determine the time constant from R1, C1, and C2 for the implementations of FIG. 12, FIG. 13, and FIG. 14.

Finally, it should be noted that the foregoing implementations are merely intended as examples. Although the present disclosure is described in detail with reference to the foregoing implementations, persons of ordinary skill in the art should understand that they may modify these implementations to obtain other implementations according to and without departing from the spirit and underlying principles of the current disclosure.

What is claimed is:

1. An optical module, comprising a circuit board, a first optical chip, a second optical chip, and a processor, wherein:
   one end of the circuit board forms an edge connector having an insertion direction;
   a surface layer on a same side of the edge connector comprises a first row of edge connector pins and a second row of edge connector pins, wherein each edge connector pin extends along the insertion direction, wherein connector pins in each row of connector pins are aligned along perpendicular to the insertion direction, and wherein the second row of edge connector pins are aligned with an offset from the first row of edge connector pins along the insertion direction;
   the first row of edge connector pins comprise a first power pin;
   the second row of edge connector pins comprise a second power pin;
   the first power pin is electrically connected to the first optical chip;
   the second power pin is electrically connected to the second optical chip and the processor;
   the first power pin and the second power pin are aligned along the insertion direction and are arranged at a same position in a direction perpendicular to the insertion direction among the first row of edge connector pins and the second row of edge connector pins; and
   the first power pin is electrically connected to the second power pin.

2. The optical module according to claim 1, wherein the first row of edge connector pins are electrically connected to wire traces on the surface layer of the circuit board, and the second row of edge connector pins are electrically connected to wire traces of an inner layer of the circuit board using connection holes on the circuit board.

3. The optical module according to claim 1, wherein the first power pin and second power pin form a single contiguous power pin.

4. The optical module according to claim 1, wherein the first optical chip comprises a laser driver circuit.

5. The optical module according to claim 1, wherein the first power pin separates from the second power pin along the insertion direction by an insulating gap smaller than a contact length of a spring plate of a corresponding socket for the edge connector.

6. The optical module according to claim 1, wherein the first power pin separates from the second power pin along the insertion direction by an insulating gap smaller than a predetermined threshold length.

7. The optical module according to claim 6, wherein the first power pin extends longer than the second power pin along the direction perpendicular to the insertion direction.

8. The optical module according to claim 6, wherein the second power pin extends longer than the first power pin along the direction perpendicular to the insertion direction.

9. The optical module according to claim 1, further comprising a first ground pin among the first row of edge connector pins and a second ground pin among the second row of edge connector pins, wherein the first ground pin aligns with the second ground pin along the insertion direction.

10. The optical module according to claim 1, further comprising a first optical transmitter electrically connected to the first optical chip and a second optical transmitter electrically connected to the second optical chip.

11. The optical module according to claim 1, further comprising an optical transmitter electrically connected to the first optical chip and an optical receiver electrically connected to the second optical chip.

12. The optical module according to claim 1, further comprising a first optical receiver electrically connected to the first optical chip and a second optical receiver electrically connected to the second optical chip.

13. The optical module according to claim 1, wherein the optical module is configured to mate with a system cage in a hot-swappable manner.

14. An optical module, comprising:
  a circuit board comprising a first circuit and a second circuit disposed on separate layers of the circuit board, and an edge connector having a insertion direction on one end of the circuit board;
  a first optical chip;
  a second optical chip; and
  a processor,
  wherein:
    the edge connector comprises a first row of edge connector pins and a second row of edge connector pins arranged respectively into a first array and a second array, wherein each edge connector pin extends along the insertion direction, wherein connector pins in each row of connector pins are aligned perpendicular to the insertion direction, and wherein the first row of edge connector pins are aligned with the first row of edge connector pins with an offset from the second row of edge connector pins along the insertion direction;
    the first row of edge connector pins comprise a first power pin electrically connected to the first optical chip using the first circuit;
    the second row of edge connector pins comprise a second power pin electrically connected to the second optical chip and the processor using the second circuit;
    the second circuit comprises a power supply delay circuit to produce an additional delay for supplying power to the second optical chip by the second power pin compared to supply of power to the first optical chip by the first power pin; and
    the first power pin and the second power pin are aligned along the insertion direction.

15. The optical module according to claim 14, wherein the power supply delay circuit comprises a resistor, a capacitor, and a field-effect transistor, wherein:
  a source electrode of the field-effect transistor is electrically connected to the second power pin and one end of the capacitor;
  a drain electrode of the field-effect transistor is electrically connected to the processor;
  a gate electrode of the field-effect transistor is electrically connected to another end of the capacitor and one end of the resistor; and
  another end of the resistor is electrically connected to ground.

16. The optical module according to claim 14, wherein the optical module is configured to mate with a system cage in a hot-swappable manner.

17. The optical module according to claim 15, further comprising a second capacitor, wherein one end of the second capacitor is electrically connected to the second power pin and another end of the second capacitor is directly electrically connected to ground.

18. The optical module according to claim 15, further comprising a second capacitor, wherein one end of the second capacitor is electrically connected to the gate electrode of the field-effect transistor and another end of the second capacitor is electrically connected to ground.

19. The optical module according to claim 15, further comprising a second capacitor, wherein one end of the second capacitor is electrically connected to the processor and another end of the second capacitor is electrically connected to ground.

20. The optical module according to claim 14, further comprising a first optical transmitter electrically connected to the first optical chip and a second optical transmitter electrically connected to the second optical chip.

* * * * *